United States Patent
Yoon

(10) Patent No.: US 10,777,853 B2
(45) Date of Patent: Sep. 15, 2020

(54) APPARATUS FOR MEASURING VARIATION IN THICKNESS OF ELECTRODE OF SECONDARY BATTERY AND SECONDARY BATTERY WITH THE SAME MOUNTED THEREIN

(71) Applicant: LG CHEM, LTD., Seoul (KR)

(72) Inventor: Jong Keon Yoon, Daejeon (KR)

(73) Assignee: LG CHEM, LTD., Seoul (KR)

(*) Notice: Subject to any disclaimer, the term of this patent is extended or adjusted under 35 U.S.C. 154(b) by 0 days.

(21) Appl. No.: 15/757,407

(22) PCT Filed: Mar. 20, 2017

(86) PCT No.: PCT/KR2017/002979
§ 371 (c)(1),
(2) Date: Mar. 5, 2018

(87) PCT Pub. No.: WO2017/213332
PCT Pub. Date: Dec. 14, 2017

(65) Prior Publication Data
US 2018/0248232 A1     Aug. 30, 2018

(30) Foreign Application Priority Data
Jun. 9, 2016     (KR) ................. 10-2016-0071636

(51) Int. Cl.
*H01M 10/48*     (2006.01)
*G01R 31/378*    (2019.01)
(Continued)

(52) U.S. Cl.
CPC ........... *H01M 10/48* (2013.01); *G01B 7/06* (2013.01); *G01B 7/16* (2013.01); *G01R 31/378* (2019.01);
(Continued)

(58) Field of Classification Search
None
See application file for complete search history.

(56) References Cited

U.S. PATENT DOCUMENTS

| 2005/0164079 A1 | 7/2005 | Kim |
| 2006/0093896 A1* | 5/2006 | Hong ........... H01M 2/34 429/61 |

(Continued)

FOREIGN PATENT DOCUMENTS

| DE | 10 2014 201 162 A1 | 7/2015 | |
| EP | 2202501 A1 * | 6/2010 | ............. G01L 5/167 |

(Continued)

OTHER PUBLICATIONS

Kamata JP-2009301960-A Espacenet English translation, 2009 (Year: 2009).*

(Continued)

*Primary Examiner* — Jonathan G Leong
*Assistant Examiner* — Kirsten B Tysl
(74) *Attorney, Agent, or Firm* — Birch, Stewart, Kolasch & Birch, LLP

(57) ABSTRACT

The present invention relates to an apparatus for measuring a variation in thickness of an electrode of a secondary battery, which is capable of measuring a variation in thickness of the electrode of the secondary battery, and a secondary battery with the same mounted therein. Also, the apparatus for measuring a variation in thickness of the electrode of the secondary battery includes a piezoelectric element inserted into a case by passing through an observation hole defined in the case, in which an electrode assembly is accommodated, and having an inner end supported by the electrode assembly and a support member installed outside the case to support an outer end of the piezoelectric element, wherein the variation in thickness of the electrode is measured by using a voltage signal gener- (Continued)

ated in the piezoelectric element according to an increase in thickness of the electrode provided in the electrode assembly.

19 Claims, 6 Drawing Sheets

(51) Int. Cl.
    *G01B 7/06*     (2006.01)
    *H01M 2/02*     (2006.01)
    *G01B 7/16*     (2006.01)
    *H01M 2/08*     (2006.01)
    *H01M 10/0525*     (2010.01)

(52) U.S. Cl.
    CPC ........... *H01M 2/023* (2013.01); *H01M 2/028* (2013.01); *H01M 2/08* (2013.01); *H01M 10/0525* (2013.01)

(56) References Cited

U.S. PATENT DOCUMENTS

| | | |
|---|---|---|
| 2006/0246345 A1 | 11/2006 | Yoon et al. |
| 2010/0021821 A1 | 1/2010 | Kim et al. |
| 2012/0133521 A1* | 5/2012 | Rothkopf ............. G01R 31/024 340/636.1 |
| 2012/0256582 A1 | 10/2012 | Kim et al. |
| 2012/0258340 A1 | 10/2012 | Park et al. |
| 2012/0276427 A1 | 11/2012 | Kim |
| 2016/0064780 A1* | 3/2016 | Jarvis ................ H01M 10/4257 429/50 |
| 2017/0047559 A1 | 2/2017 | Yoo et al. |
| 2017/0074634 A1* | 3/2017 | Yoon ...................... G01B 21/08 |

FOREIGN PATENT DOCUMENTS

| | | | |
|---|---|---|---|
| JP | 2009301960 A | * | 12/2009 |
| JP | 2013-89340 A | | 5/2013 |
| KR | 10-2005-0077324 A | | 8/2005 |
| KR | 10-2006-0110576 A | | 10/2006 |
| KR | 10-2007-0112717 A | | 11/2007 |
| KR | 10-2012-0113674 A | | 10/2012 |
| KR | 10-2015-0099896 A | | 9/2015 |
| KR | 10-2016-0063278 A | | 6/2016 |

OTHER PUBLICATIONS

European Search Report for Appl. No. 17810455.0 dated Jun. 26, 2018.

* cited by examiner

APPARATUS FOR MEASURING VARIATION IN THICKNESS OF ELECTRODE OF SECONDARY BATTERY AND SECONDARY BATTERY WITH THE SAME MOUNTED THEREIN

CROSS-REFERENCE TO RELATED APPLICATION

The present application claims the benefit of the priority of Korean Patent Application No. 10-2016-0071636, filed on Jun. 9, 2016, which is hereby incorporated by reference in its entirety.

TECHNICAL FIELD

The present invention relates to an apparatus for measuring a variation in thickness of an electrode of a secondary battery and a secondary battery with the same mounted therein, and more particularly, to an apparatus for measuring a variation in thickness of an electrode of a secondary battery, which is capable of measuring a variation in thickness of the electrode of the secondary battery, and a secondary battery with the same mounted therein.

BACKGROUND ART

Batteries (cells) that generate electric power through physical or chemical reaction to supply the generated power to the outside are used when AC power to be supplied to the building is not obtained, or DC power is required according to the living environments surrounded by various electric and electronic devices.

Among such batteries, primary batteries and secondary batteries, which are chemical cells using chemical reaction, are generally used. The primary batteries are consumable cells which are collectively referred to as dry cells. Also, secondary batteries are rechargeable batteries that are manufactured by using a material in a redox process between current and a substance is repeatable several times. When the reduction reaction is performed on the material by the current, power is charged, and when the oxidation reaction is performed on the material, power is discharged. Such the charging-discharging is repeatedly performed to generate electricity.

A lithium ion battery of the secondary batteries is manufactured through the following processes. An active material is applied to each of a positive electrode conductive foil and a negative electrode conductive foil at a predetermined thickness, and a separator is disposed between the positive electrode conductive foil and the negative electrode conductive foil, and then, an electrode assembly, in which the positive electrode conductive foil, the separator, and the negative electrode conductive foil are stacked, is accommodated into a prismatic can, a pouch, and the like to seal the resultant product, thereby manufacturing the lithium ion battery.

A secondary battery including an electrode for improving safety when the battery is overcharged according to the related art is disclosed in Korean Patent Publication No. 10-2007-0112717.

However, in the secondary battery according to the related art, various phenomena and changes occur in an electrode assembly during operation. Although the results obtained through real-time observation of the various phenomena and changes are capable of being utilized for diagnosis and improvement of basic research performance, it is difficult to observe the electrode assembly having a structure, in which a negative electrode, a separator, and a positive electrode are stacked, because the electrode assembly is sealed within an opaque battery case.

DISCLOSURE OF THE INVENTION

Technical Problem

Therefore, the present invention has been made to solve the abovementioned limitations, and an object of the prevent invention is to provide an apparatus for measuring a variation in thickness of an electrode of a secondary battery, which is capable of measuring a variation in thickness of the electrode in real-time, and a secondary battery with the same mounted therein.

Technical Solution

An apparatus for measuring a variation in thickness of an electrode of a secondary battery according to an embodiment of the present invention includes a piezoelectric element inserted into a case by passing through an observation hole defined in the case, in which an electrode assembly is accommodated, and having an inner end supported by the electrode assembly and a support member installed outside the case to support an outer end of the piezoelectric element, wherein the variation in thickness of the electrode is measured by using a voltage signal generated in the piezoelectric element according to an increase in thickness of the electrode provided in the electrode assembly.

The apparatus may further include a blocking layer disposed between the electrode assembly and the piezoelectric element, wherein the inner end of the piezoelectric element may be supported by the electrode assembly in a state of coming into contact with the blocking layer.

The apparatus may further include a sealing member configured to seal a gap between the blocking layer and the case.

The blocking layer may have a transparent portion, and a hole communicating with the transparent portion may be defined in the piezoelectric element and the support member.

The support member may include: a support plate supporting the outer end of the piezoelectric element and a fixing member coupling the support plate to the case.

The support member may include an elastic member surrounding the fixing member and allowing the support member to be coupled to the case so that the support member is movable with restoring force.

A secondary battery according to an embodiment of the present invention includes a case in which an electrode assembly is accommodated, an observation hole passing through one side of the case to communicate with the electrode assembly, and a piezoelectric element inserted into the case through the observation hole, having an inner end supported by the electrode assembly to generate a voltage pulse according to a variation in thickness of the electrode assembly, and comprising a support member disposed on an outer end and installed outside the case.

A negative electrode of the electrode assembly may be accommodated in the observation hole.

The secondary battery may further include a blocking layer disposed between the electrode assembly and the piezoelectric element, wherein the inner end of the piezoelectric element may be supported by the electrode assembly in a state of coming into contact with the blocking layer.

The secondary battery may further include a sealing member configured to seal a gap between the blocking layer and the case.

The case may include a body part accommodating the electrode assembly and a cover disposed to be penetrated by the piezoelectric element at a side of the body part in which the observation hole is defined to support the blocking layer from the outside.

The secondary battery may further include a current collection member disposed between the electrode assembly and the sealing member to transfer electrons of the electrode assembly.

The secondary battery may further include a negative electrode contact member extending from the current collection member to the outside of the body part.

The cover may have an inner circumference less than a circumference of the blocking layer and greater than a circumference of the piezoelectric element.

A separator and a positive electrode of the electrode assembly may be accommodated in an accommodation part provided in the body part to communicate with the observation hole.

The observation hole may have a circumference greater than that of the negative electrode of the electrode assembly, and the accommodation part may have a circumference less than that of the negative electrode of the electrode assembly.

The secondary battery may further include a positive electrode contact member extending from a positive electrode to the outside of the body part.

The secondary battery may further include an insulation member surrounding a circumference of the positive electrode contact member.

In the electrode assembly, a negative electrode may be disposed on a side of the piezoelectric element, and a positive electrode may be disposed on an opposite side.

Advantageous Effects

According to the present invention, there is an effect of measuring a variation in thickness of the electrode due to the electrochemical reaction of the electrode of the secondary battery.

According to the present invention, there is an effect of measuring a variation in thickness of the electrode of the secondary battery in real-time.

According to the present invention, there is an effect of measuring a variation in thickness of the electrode of the secondary battery through the electrochemical reaction together with the optical measurement.

MODE FOR CARRYING OUT THE INVENTION

Figure 1:
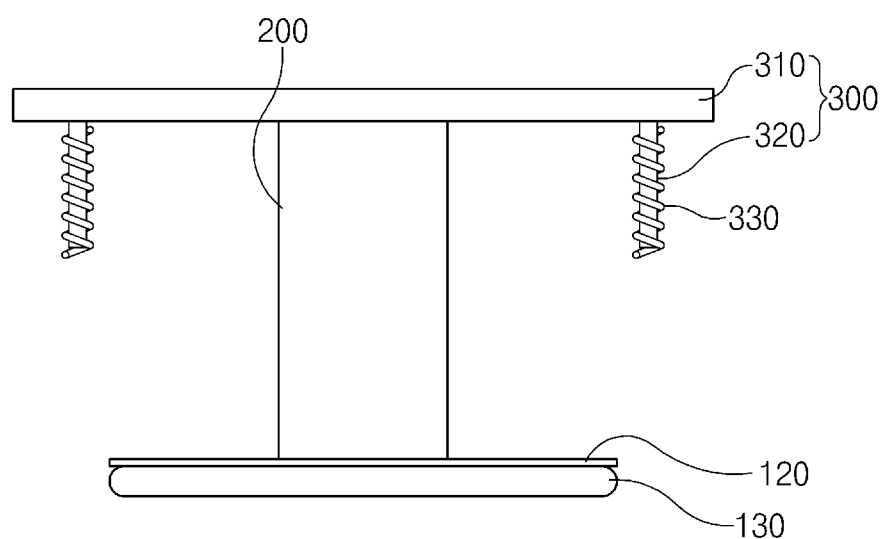
FIG. 1 is a front view illustrating an apparatus for measuring a variation in thickness of an electrode of a secondary battery according to an embodiment of the present invention.

Hereinafter, an apparatus for measuring a variation in thickness of an electrode of a secondary battery and a secondary battery with the same mounted therein according to a preferred embodiment of the present invention will be described in more detail with reference to the accompanying drawings.

Terms or words used in the specification and claims should not be construed as limited to a lexical meaning, and should be understood as appropriate notions by the inventor based on that he/she is able to define terms to describe his/her invention in the best way to be seen by others. Therefore, embodiments and drawings described herein are simply exemplary and not exhaustive, and it will be understood that various equivalents may be made to take the place of the embodiments.

In the drawings, the dimension of each of components or a specific portion constituting the component is exaggerated, omitted, or schematically illustrated for convenience in description and clarity. Thus, the dimension of each element does not entirely reflect an actual size. Moreover, detailed descriptions related to well-known functions or configurations will be ruled out in order not to unnecessarily obscure subject matters of the present invention.

Figure 2:
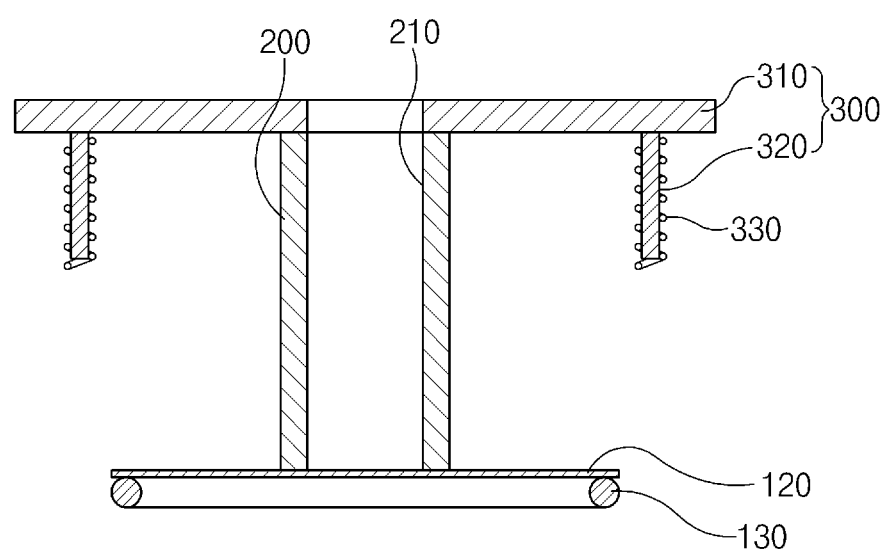
FIG. 2 is a cross-sectional view of FIG. 1.
Figure 3:
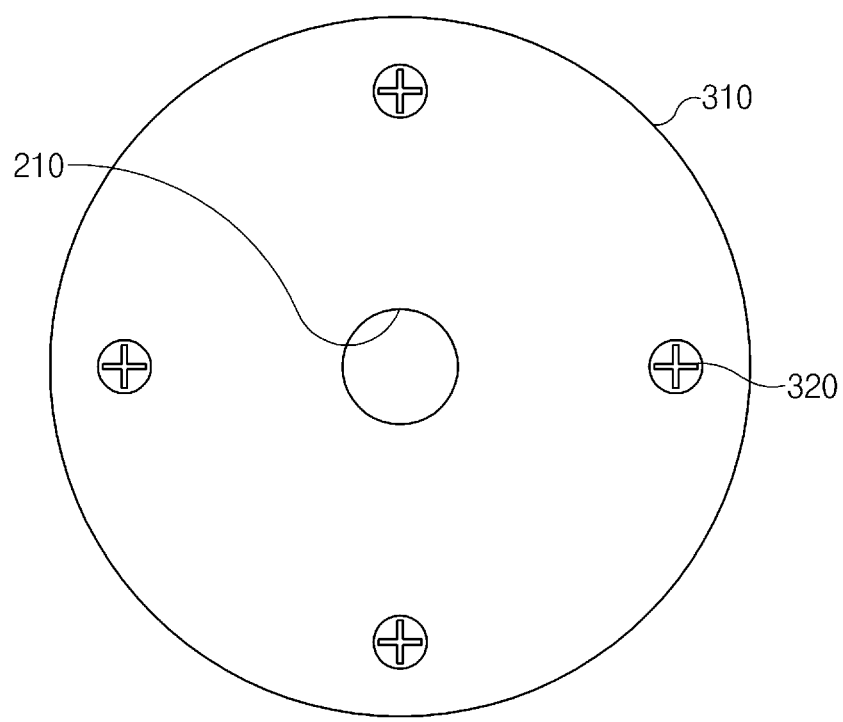
FIG. 3 is a plan view of FIG. 1.
Figure 4:
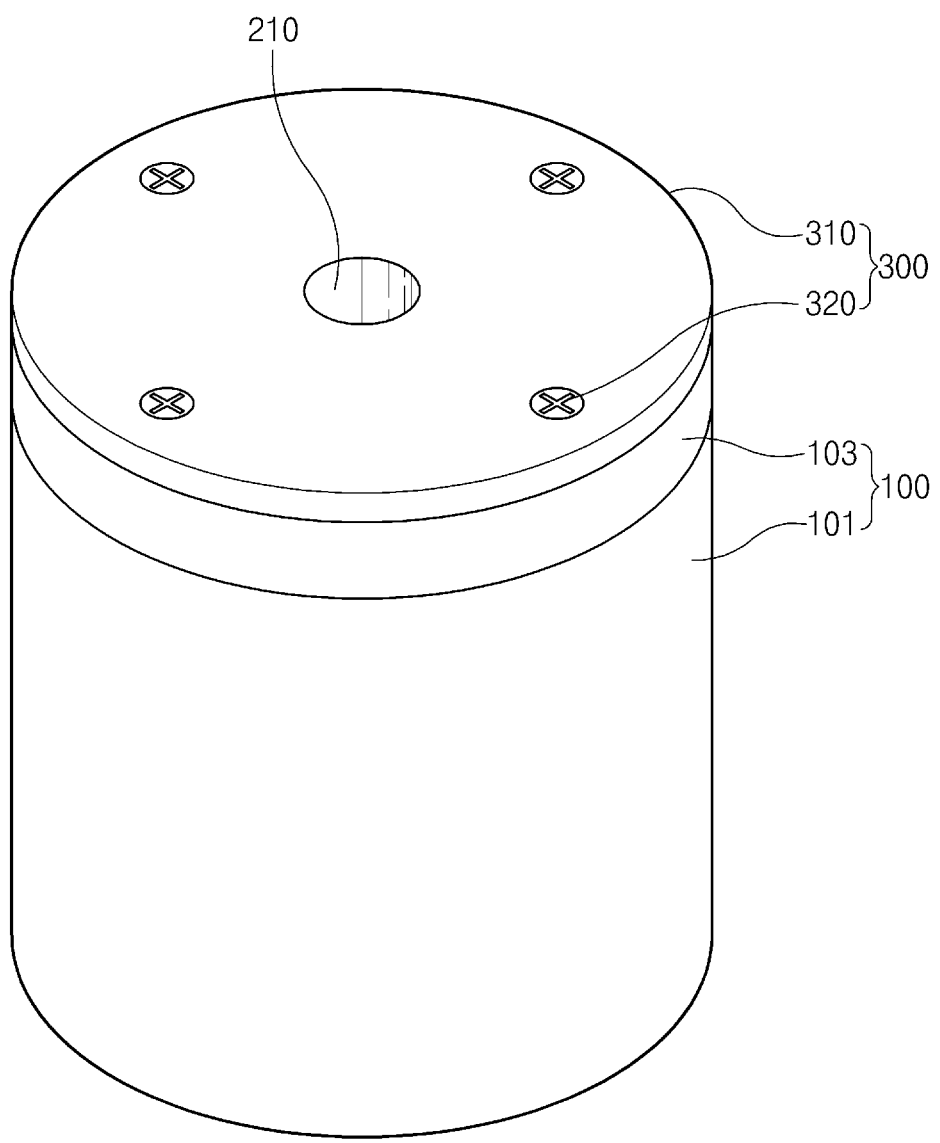
FIG. 4 is a perspective view illustrating a secondary battery, in which the apparatus for measuring a variation in thickness of the electrode of the secondary battery is mounted, according to an embodiment of the present invention.
Figure 5:
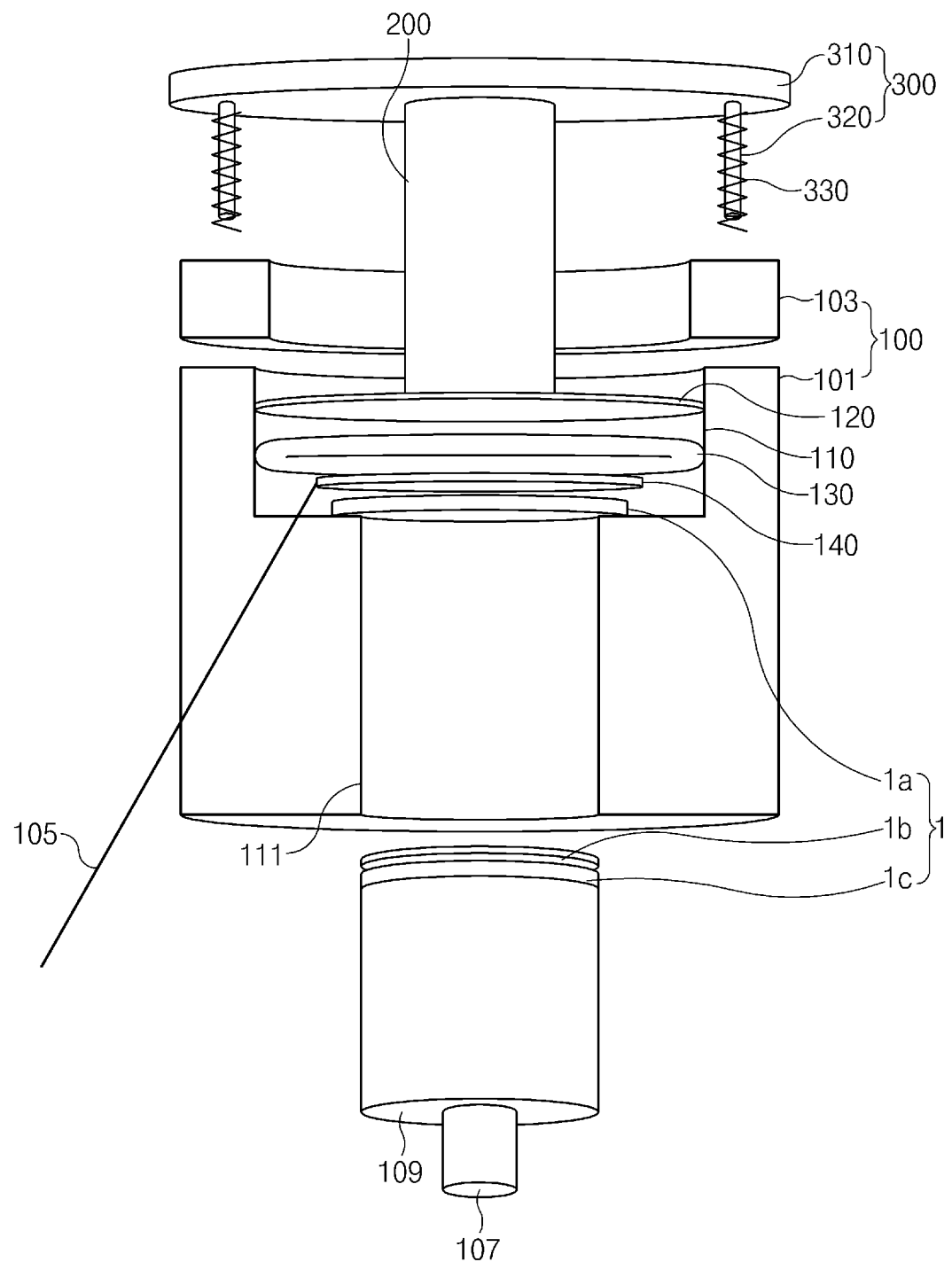
FIG. 5 is a partial cutaway and exploded perspective view of the secondary battery, in which the apparatus for measuring a variation in thickness of the electrode of the secondary battery is mounted, according to an embodiment of the present invention.
Figure 6:
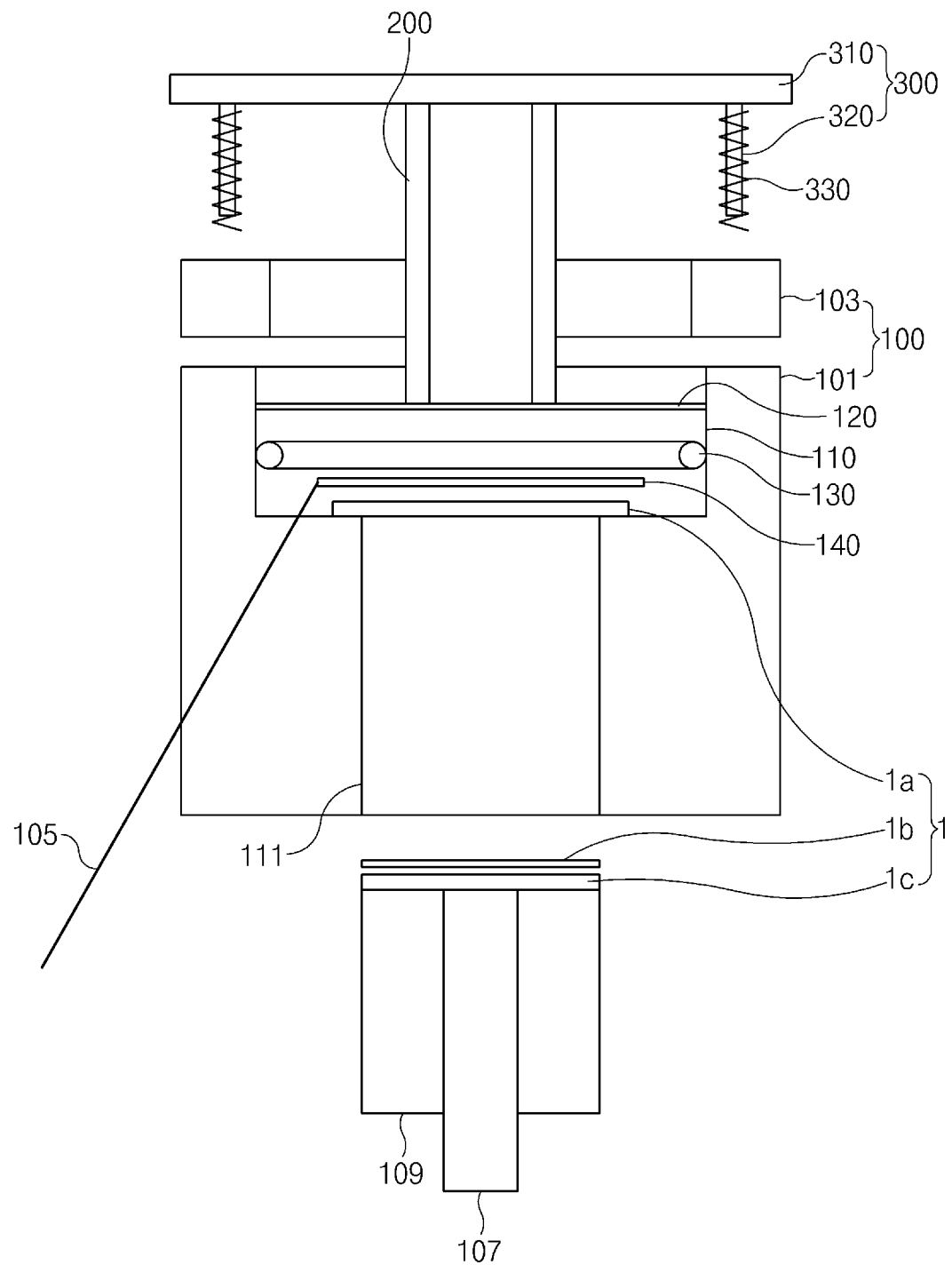
FIG. 6 is a cross-sectional view of FIG. 5.

FIG. 1 is a front view illustrating an apparatus for measuring a variation in thickness of an electrode of a secondary battery according to an embodiment of the present invention, FIG. 2 is a cross-sectional view of FIG. 1, FIG. 3 is a plan view of FIG. 1, FIG. 4 is a perspective view illustrating a secondary battery, in which the apparatus for measuring a variation in thickness of the electrode of the secondary battery is mounted, according to an embodiment of the present invention, FIG. 5 is a partial cutaway and exploded perspective view of the secondary battery, in which the apparatus for measuring a variation in thickness of the electrode of the secondary battery is mounted, according to an embodiment of the present invention, and FIG. 6 is a cross-sectional view of FIG. 5. As illustrated in FIGS. 1 to 6, an apparatus for measuring a variation in thickness of an electrode of a secondary battery according to an embodiment of the present invention includes a piezoelectric element 200 inserted into the case 100 by passing through an observation hole 110 defined in a case 100, in which an electrode assembly 1 is accommodated, and having an inner end supported by the electrode assembly 1 and a support member 300 installed outside the case 100 to support an outer end of the piezoelectric element 200.

The piezoelectric element 200 generates a voltage signal by a pressure (or action of force) due to an increase in thickness of the electrode provided in the electrode assembly 1 in which the inner end is supported in a state in which the outer end is coupled to the outside of the case 100.

Also, the increase in thickness of the electrode may be measured by the voltage signal generated in the piezoelectric element 200.

A signal line may be connected to the piezoelectric element 200 to measure the voltage signal generated in the piezoelectric element 200.

Also, the piezoelectric element 200 may have a penetrated hollow shape.

The support member 300 includes a support plate 310 supporting an outer end of the piezoelectric element 200 and a fixing member 320 for coupling the support plate 310 to the case 100.

A portion of the support plate 310, which corresponds to the hollow part of the piezoelectric element 200, may be penetrated.

Also, a hole 210 communicating with the hollow part of the piezoelectric element 200 and the through-part of the support plate 310 may be formed.

The fixing member 320 may be provided in plurality on the support plate 310 and include a fixing pin, a bolt, and the like, which couples the support plate 310 to the case 100. The support plate 310 may be coupled to the case 100 so as to be elevated to approach or be away from the case 100 along a circumference of the fixing member 320.

That is, in the apparatus for measuring a variation in thickness of the electrode of the secondary battery according to an embodiment of the present invention, the support plate 310 may be coupled to the fixing member 320 so that the support plate 310 is elevated to approach or be away from the case 100 according to a variation in thickness of the electrode provided in the electrode assembly 1.

Also, an elastic member 330 such as a spring, rubber, and the like may be installed around the fixing member 320 to allow the moving support plate 310 to return to its original position.

The elastic member 330 such as the spring, the rubber, and the like may control force for the elevation of the support plate 310 when the support plate 310 is elevated according to a variation in thickness of the electrode provided in the electrode assembly 1.

Also, a blocking layer 120 may be disposed on the inner end of the piezoelectric element 200.

The blocking layer 120 may be disposed between the electrode assembly 1 and the piezoelectric element 200 so that the piezoelectric element 200 is supported by the electrode assembly 1 in a state of coming into contact with the blocking layer 120.

When the apparatus for measuring a variation in thickness of the electrode of the secondary battery is installed in the secondary battery, the blocking layer 120 may prevent an electrolyte within the secondary battery from leaking to the outside. Also, to enhance sealing of the blocking layer 120, a sealing member 130 such as an O-ring may be installed between the blocking layer 120 and the case 100.

Also, the blocking layer 120 may have a transparent portion. Particularly, the electrode assembly 1 within case 100 may be optically confirmed through the hole 210 communicating with the hollow part of the piezoelectric element 200 and the through-part of the support plate 310 and the hole 210 communicating with the transparent portion of the blocking layer 120.

Also, the electrode may be optically monitored to measure a change occurring on a surface of the electrode.

As illustrated in FIGS. 4 to 6, the secondary battery in which the apparatus for measuring a variation in thickness of the electrode of the secondary battery is mounted according to an embodiment of the present invention includes the case 100 in which the electrode assembly 1 is accommodated, the observation hole 110 passing through one side of the case 100 to communicate with the electrode assembly 1, and the piezoelectric element 200 inserted into the case 100 through the observation hole 110, having the inner end supported by the electrode assembly 1 to generate a voltage pulse according to a variation in thickness of the electrode assembly 1, and including the support member 300 disposed on the outer end and installed outside the case 100.

The electrode assembly 1 may include, a positive electrode 1c coated with a positive electrode active material, a negative electrode 1a coated with a negative electrode active material, and a separator 1b disposed between the positive electrode 1c and the negative electrode 1a.

The positive electrode 1c may be an aluminum plate and include a positive electrode active material portion coated with a positive electrode active material and a positive electrode non-coating portion which is not coated with the positive electrode active material.

The positive electrode active material may include a lithium-containing transition metal oxide such as $LiCoO_2$, $LiNiO_2$, $LiMnO_2$, and $LiMnO_4$ or a lithium chalcogenide compound.

The positive electrode active material portion may be formed, for example, by applying the positive electrode active material to a portion of at least one surface of the aluminum plate, and the remaining portion of the aluminum plate, which is not coated with the positive electrode active material, may be the positive electrode non-coating portion.

The negative electrode 1a may be a copper plate and include a negative electrode active material portion coated with a negative electrode active material and a negative electrode non-coating portion which is not coated with the negative electrode active material.

The negative electrode active material may be a carbon material such as crystalline carbon, amorphous carbon, a carbon composite, and a carbon fiber, a lithium metal, or a lithium alloy.

The negative electrode active material portion may be formed, for example, by applying the negative electrode active material to a portion of at least one surface of the copper plate, and the remaining portion of the copper plate, which is not coated with the negative electrode active material, may be the negative electrode non-coating portion.

The separator 1b may be manufactured by applying a polyvinylidene fluoride-hexafluoropropylene copolymer (PVDF-HFP co-polymer) to one base material selected from the group consisting of, for example, polyethylene (PE), polystyrene (PS), polypropylene (PP), and a copolymer of polyethylene (PE) and polypropylene.

The case 100 may be a container made of a metal material and having a shape that is opened substantially upward in the cylindrical secondary battery. The case 100 may be made of iron (Fe) on which aluminum (Al) or nickel (Ni), which is light and easy to cope with corrosion, is plated.

The case 100 may include a body part 101 accommodating the electrode assembly 1 and the electrolyte and a cover 103 coupled to cover an end of a side of the body part 101, in which the observation hole 110 is formed.

The cover 103 includes a hollow part having a hollow communicating with the observation hole 110. The piezoelectric element 200 is inserted into the observation hole 110 by passing through the hollow part of the cover 103.

Also, an inner circumference of the cover 103, i.e., a circumference of the hollow part of the cover 103 may be less than that of the blocking layer 120 and greater than that of the piezoelectric element 200.

Thus, the piezoelectric element 200 may prevent the blocking layer 120 disposed on the inner end of the piezoelectric element 200 from passing through the hollow part of the cover 103 while being movable through the hollow part of the cover 103.

Thus, the piezoelectric element 200 may be limited in moving distance by the cover 103 so that the piezoelectric element 200 does not deviate from the observation hole 110.

Also, the circumference of the blocking layer 120 may have the same size as the observation hole 110 to prevent the electrolyte accommodated in the body part 101 from leaking.

Also, the sealing member 130 may be disposed between the circumference of the blocking layer 120 and the circumference of the observation hole 110 to supplement the sealing function of the blocking layer 120.

Also, the negative electrode 1*a* of the electrode assembly 1 may be accommodated in the observation hole 110, and a current collection member 140 may be disposed between the negative electrode 1*a* and the sealing member 130.

The current collection member 140 may serve as transfer electrons through the negative electrode 1*a*. A negative electrode contact member 105 may be connected to the current collection member 140 to extent from the current collection member 140 to the outside of the case 100, thereby preventing the current collection member 140 from coming into contact with the negative electrode at the outside.

Also, an accommodation part 111 communicating with the observation hole 110 to pass through the body part 101 and accommodating the separator 1*b* and the positive electrode 1*c* of the electrode assembly 1 may be provided in the body part 101.

Here, the observation hole 110 may have a circumference greater than that of the negative electrode 1*a* of the electrode assembly 1, and the accommodation part 111 may have a circumference less than that of the negative electrode 1*a* of the electrode assembly 1.

Thus, the negative electrode 1*a* may not pass through the accommodation part 111 by being caught by the accommodation part 111 to prevent the electrode assembly 1 from being separated from the body part 101 through the accommodation part 111.

Also, a positive electrode contact member 107 extending from the positive electrode 1*c* is disposed on the positive electrode 1*c*.

The positive electrode contact member 107 extends from the positive electrode 1*c* so as to be exposed to the outside of the accommodation part 111.

Also, the secondary battery according to this embodiment may include an insulation member 109 surrounding a circumference of the positive electrode contact member 107.

The insulation member 109 may insulate the positive electrode contact member 107 from the body part 101 and seal the positive electrode contact member 107 to prevent the positive electrode contact member 107 from being exposed to the electrolyte in the body part 101.

In the electrode assembly 1, the negative electrode may be disposed on a side of the piezoelectric element 200, and the positive electrode may be disposed on an opposite side.

As described above, according to the present invention, there is an effect of measuring a variation in thickness of the electrode due to the electrochemical reaction of the electrode of the secondary battery.

According to the present invention, there is an effect of measuring a variation in thickness of the electrode of the secondary battery in real-time.

According to the present invention, there is an effect of measuring a variation in thickness of the electrode of the secondary battery through the electrochemical reaction together with the optical measurement.

Although the apparatus for measuring a variation in thickness of the electrode of the secondary battery and the secondary battery with the same mounted therein according to the present invention has been described above with reference to the exemplary drawings, various changes and modifications may be made thereto by one skilled in the art without departing from the scope and spirit of the invention as set forth in the appended claims.

The invention claimed is:

1. An apparatus for measuring a variation in thickness of an electrode of a secondary battery, the apparatus comprising: a piezoelectric element insertable into a case by passing through an observation hole defined in the case, in which an electrode assembly is accommodated, and having an inner end supportable by the electrode assembly; a support plate installable outside the case to support an outer end of the piezoelectric element; a blocking layer disposable between the electrode assembly and the piezoelectric element, the blocking layer being spaced from the support plate and only connected to the support plate via the piezoelectric element; and a fixing member having a first end at a lower surface of the support plate and a free, second end extending toward an upper surface of the blocking layer.

2. The apparatus of claim 1, further comprising a sealing member configured to seal a gap between the blocking layer and the case.

3. An apparatus for measuring a variation in thickness of an electrode of a secondary battery, the apparatus comprising:
   a piezoelectric element insertable into a case by passing through an observation hole defined in the case, in which an electrode assembly is accommodated, and having an inner end supportable by the electrode assembly;
   a support member installable outside the case to support an outer end of the piezoelectric element;
   a blocking layer disposable between the electrode assembly and the piezoelectric element, the blocking layer having a transparent portion,
   wherein a hole communicating with the transparent portion is defined in the piezoelectric element and the support member.

4. The apparatus of claim 3, wherein the support member comprises:
   a support plate supporting the outer end of the piezoelectric element; and
   a fixing member coupling the support plate to the case.

5. The apparatus of claim 4, wherein the support member comprises an elastic member surrounding the fixing member to allow the support member to be coupled to the case so that the support member is movable with a restoring force.

6. A secondary battery comprising:
   a case in which an electrode assembly is accommodated;
   an observation hole passing through one side of the case to communicate with the electrode assembly; and
   the apparatus of claim 1, wherein the piezoelectric element is inserted into the case through the observation hole, and
   wherein the support plate is disposed on the outer end of the piezoelectric element and installed outside the case.

7. The secondary battery of claim 6, wherein a negative electrode of the electrode assembly is accommodated in the observation hole.

8. The secondary battery of claim 6, wherein the blocking layer is disposed between the electrode assembly and the piezoelectric element, and wherein the inner end of the piezoelectric element is supported by the electrode assembly in a state of coming into contact with the blocking layer.

9. The secondary battery of claim 8, further comprising a sealing member configured to seal a gap between the blocking layer and the case.

10. The secondary battery of claim 8, wherein the case comprises:
a body part accommodating the electrode assembly; and
a cover disposed to be penetrated by the piezoelectric element at a side of the body part in which the observation hole is defined to support the blocking layer from the outside.

11. The secondary battery of claim 9, further comprising a current collection member disposed between the electrode assembly and the sealing member to transfer electrons of the electrode assembly.

12. The secondary battery of claim 11, further comprising a negative electrode contact member extending from the current collection member to the outside of the body part.

13. The secondary battery of claim 10, wherein the cover has an inner circumference less than a circumference of the blocking layer and greater than a circumference of the piezoelectric element.

14. The secondary battery of claim 10, wherein a separator and a positive electrode of the electrode assembly are accommodated in an accommodation part provided in the body part to communicate with the observation hole.

15. The secondary battery of claim 14, wherein the observation hole has a circumference greater than that of the negative electrode of the electrode assembly, and the accommodation part has a circumference less than that of the negative electrode of the electrode assembly.

16. The secondary battery of claim 10, further comprising a positive electrode contact member extending from a positive electrode to the outside of the body part.

17. The secondary battery of claim 16, further comprising an insulation member surrounding a circumference of the positive electrode contact member.

18. The secondary battery of claim 6, wherein, in the electrode assembly, a negative electrode is disposed on a side of the piezoelectric element, and a positive electrode is disposed on an opposite side.

19. The apparatus of claim 1, wherein the fixing member is provided as a plurality of fixing members evenly spaced about a perimeter of the support plate.

* * * * *